(12) United States Patent
Hilsenbeck

(10) Patent No.: US 11,348,789 B2
(45) Date of Patent: May 31, 2022

(54) METHOD FOR MANUFACTURING SEMICONDUCTOR DEVICE WITH METALLIZATION STRUCTURE

(71) Applicant: Infineon Technologies AG, Neubiberg (DE)

(72) Inventor: Jochen Hilsenbeck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/995,911

(22) Filed: Aug. 18, 2020

(65) Prior Publication Data

US 2020/0381254 A1 Dec. 3, 2020

Related U.S. Application Data

(63) Continuation of application No. 15/950,679, filed on Apr. 11, 2018, now abandoned.

(30) Foreign Application Priority Data

Apr. 12, 2017 (DE) .......................... 102017107952.1

(51) Int. Cl.
  *H01L 21/04* (2006.01)
  *H01L 23/00* (2006.01)
  (Continued)

(52) U.S. Cl.
  CPC ...... *H01L 21/0485* (2013.01); *H01L 23/3736* (2013.01); *H01L 23/482* (2013.01); *H01L 24/02* (2013.01); *H01L 24/05* (2013.01); *H01L 29/401* (2013.01); *H01L 29/417* (2013.01); *H01L 29/41758* (2013.01); *H01L 29/45* (2013.01); *H01L 29/47* (2013.01);
  (Continued)

(58) Field of Classification Search
  CPC .................................................... H01L 21/0485
  USPC ......................................................... 438/602
  See application file for complete search history.

(56) References Cited

U.S. PATENT DOCUMENTS 5,841,197 A 11/1998 Adamic, Jr.
5,883,010 A 3/1999 Merrill
(Continued)

FOREIGN PATENT DOCUMENTS

JP 2007184571 A 7/2007
JP 2013201413 A 10/2013
(Continued)

OTHER PUBLICATIONS

Machine translation of Nakanishi et al., JP 2017-063145, Mar. 30, 2017 (Year: 2017).*

*Primary Examiner* — Hsin Yi Hsieh
(74) *Attorney, Agent, or Firm* — Murphy, Bilak & Homiller, PLLC

(57) ABSTRACT

A method for manufacturing a semiconductor device includes: providing a semiconductor substrate having first and second sides; forming at least one doping region at the first side; forming a first metallization structure at the first side on and in contact with the at least one doping region; and subsequently forming a second metallization structure at the second side, the second metallization structure forming at least one silicide interface region with the semiconductor substrate and at least one non-silicide interface region with the semiconductor substrate.

10 Claims, 14 Drawing Sheets

(51) Int. Cl.
  *H01L 23/482* (2006.01)
  *H01L 29/417* (2006.01)
  *H01L 23/373* (2006.01)
  *H01L 29/40* (2006.01)
  *H01L 29/45* (2006.01)
  *H01L 29/47* (2006.01)
  *H01L 23/367* (2006.01)
  *H01L 29/16* (2006.01)

(52) U.S. Cl.
  CPC ...... *H01L 23/3672* (2013.01); *H01L 29/1608* (2013.01); *H01L 2224/02166* (2013.01); *H01L 2224/0401* (2013.01); *H01L 2224/04042* (2013.01); *H01L 2224/05* (2013.01); *H01L 2224/05138* (2013.01); *H01L 2224/05647* (2013.01); *H01L 2924/10272* (2013.01)

(56) References Cited

U.S. PATENT DOCUMENTS

| | | | |
|---|---|---|---|
| 6,320,205 | B1 | 11/2001 | Pfirsch et al. |
| 10,347,490 | B2* | 7/2019 | Rupp ............... H01L 29/417 |
| 2008/0258183 | A1* | 10/2008 | Rupp ............ H01L 29/66068 |
| | | | 257/256 |
| 2010/0207125 | A1 | 8/2010 | Uchida et al. |
| 2011/0204383 | A1 | 8/2011 | Yamamoto et al. |
| 2011/0272711 | A1* | 11/2011 | Okano ........... H01L 29/66143 |
| | | | 257/77 |
| 2015/0372153 | A1 | 12/2015 | Hori et al. |
| 2016/0276452 | A1 | 9/2016 | Konrath et al. |
| 2017/0170280 | A1* | 6/2017 | Wakabayshi ....... H01L 21/268 |

FOREIGN PATENT DOCUMENTS

| | | |
|---|---|---|
| JP | 2017063145 A | 3/2017 |
| WO | 2016162987 A1 | 10/2016 |

* cited by examiner

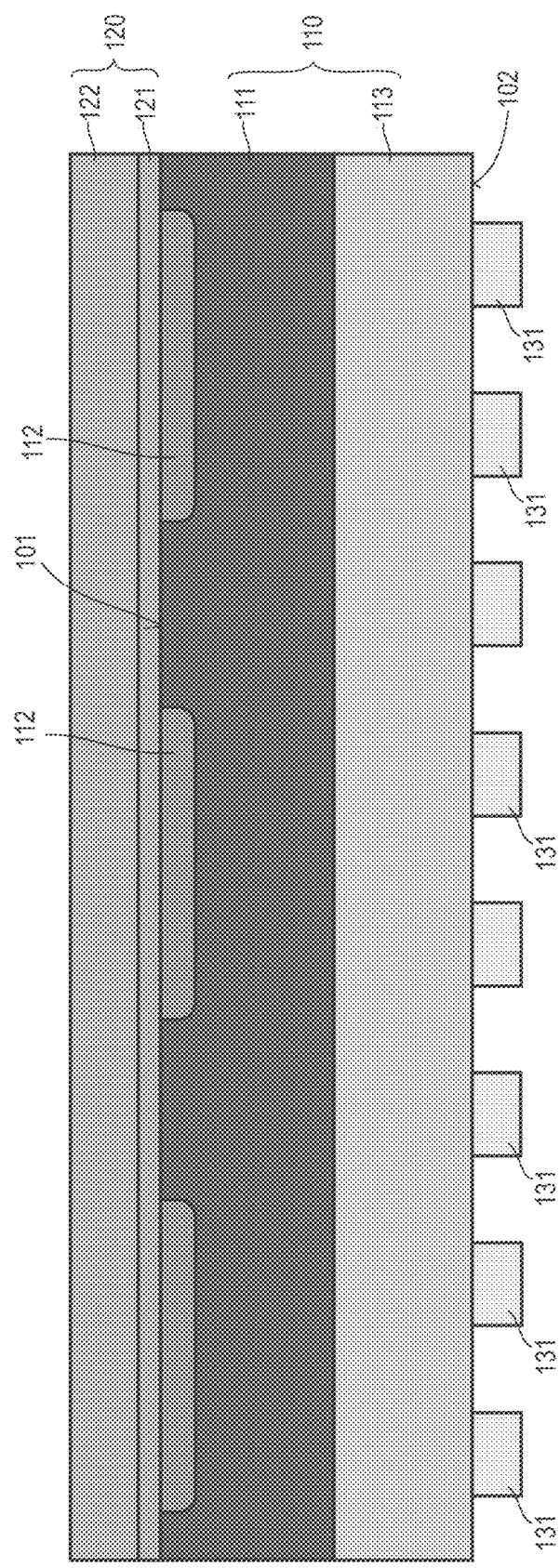

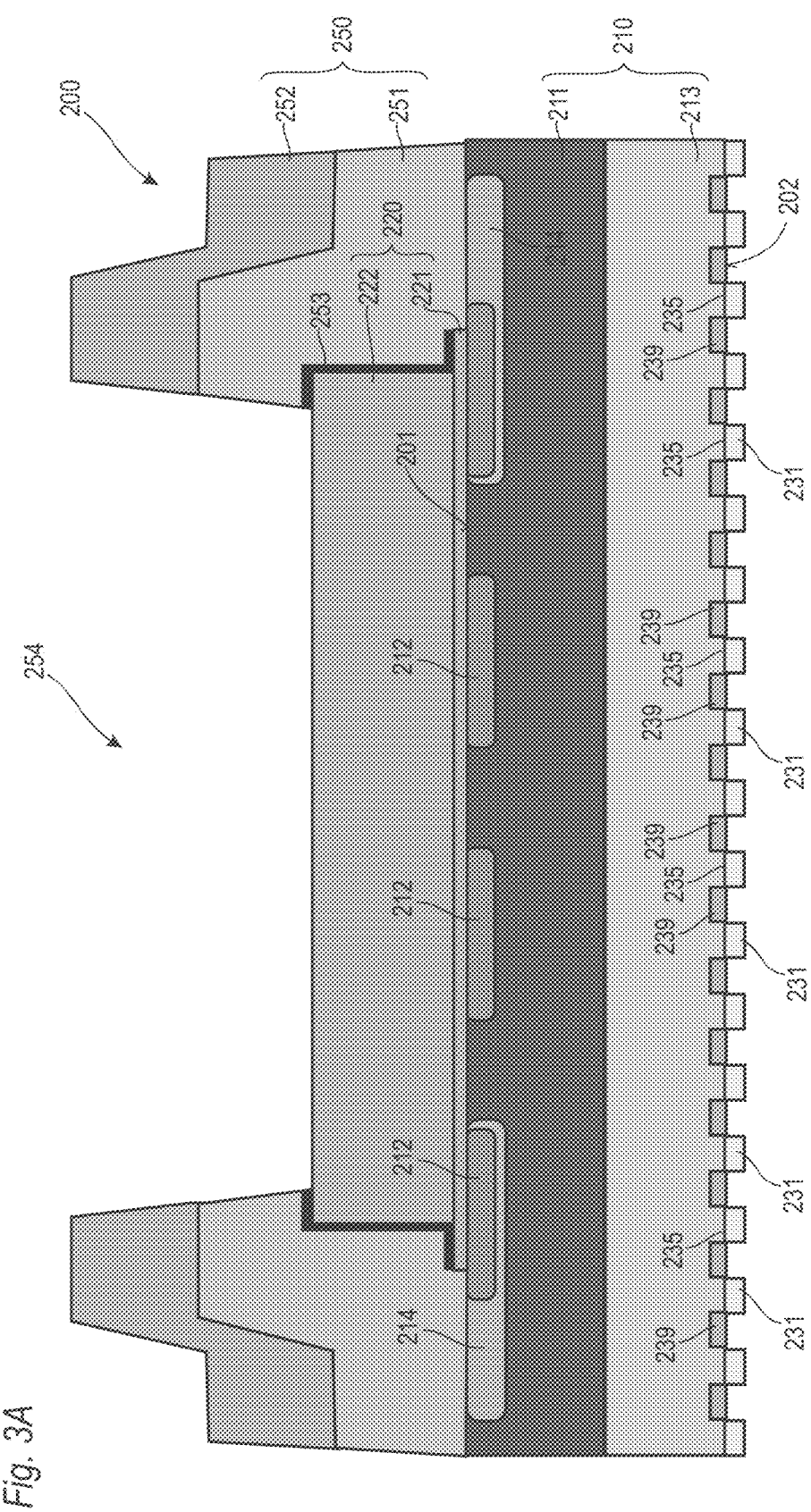

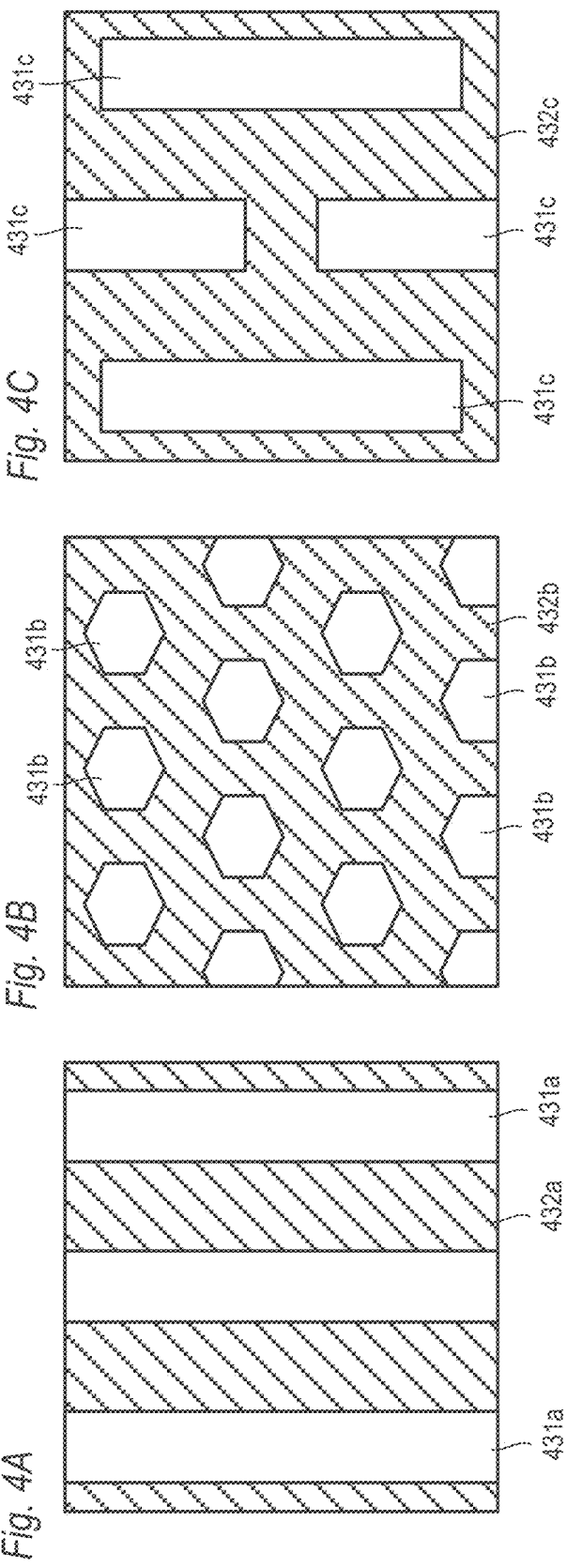

METHOD FOR MANUFACTURING SEMICONDUCTOR DEVICE WITH METALLIZATION STRUCTURE

TECHNICAL FIELD

Embodiments described herein relate to semiconductor devices having a metallization structure with silicide and non-silicide regions. Further embodiments pertain to methods for manufacturing semiconductor devices having a metallization structure with silicide and non-silicide regions.

BACKGROUND

Semiconductor devices include metal structures to contact the active regions of the semiconductor substrate. For example, Al-based metal structures or layers are typically formed in contact with active regions at the front side of the semiconductor substrate. Bond wires attached to the Al-based metal structures provide the connection to lead-outs of the package into which the semiconductor device is integrated or embedded. Examples of packages are discrete TO-packages to accommodate a single semiconductor device or power modules housing two or more separate semiconductor devices.

Vertical semiconductor devices need an additional electrical contact at the backside of the semiconductor substrate which is provided by a so-called backside metallization. In addition to providing a low ohmic contact resistance to the semiconductor substrate, the backside metallization also provides a mechanical connection between the semiconductor substrate and a housing or carrier substrate. Typically, the backside metallization is soldered to a lead frame. The solder connection needs to be reliable throughout the live time of the semiconductor device and should withstand mechanical stress caused by thermal cycling occurring during operation of the semiconductor device.

For providing a good and reliable ohmic connection, a metal layer capable of forming a silicide interface with the semiconductor substrate is typically formed in direct contact with the semiconductor substrate. The silicide interface layer is subsequently formed by a thermal anneal followed by a deposition of a metal layer having a good solderability. In case of SiC as material for the semiconductor substrate, reaction between the metal and the SiC may lead to the formation of carbon clusters, or C-clusters. These C-clusters act like perforations of the metal layer and can therefore weaken the mechanical stability of the metal layer.

Attempts have been made to reduce formation of the C-clusters by appropriately selecting the material composition of the metal layer and the process conditions of the thermal anneal. However, there is need for further improvement.

SUMMARY

According to an embodiment, a semiconductor device includes a semiconductor substrate having a first side and a second side, and at least one doping region formed at the first side of the semiconductor substrate. A first metallization structure at the first side of the semiconductor substrate is on and in contact with the at least one doping region. A second metallization structure at the second side of the semiconductor substrate forms at least one silicide interface region with the semiconductor substrate and at least one non-silicide interface region with the semiconductor substrate.

According to an embodiment, a semiconductor device includes a semiconductor substrate having a first side and a second side, and at least one doping region formed at the first side of the semiconductor substrate. A first metallization structure at the first side of the semiconductor substrate is on and in contact with the at least one doping region. A second metallization structure at the second side of the semiconductor substrate forms regions of different adhesion with the semiconductor substrate.

According to an embodiment, a method for manufacturing a semiconductor device includes providing a semiconductor substrate having a first side and a second side. At least one doping region is formed at the first side of the semiconductor substrate. A first metallization structure is formed at the first side of the semiconductor substrate on and in contact with the at least one doping region. A second metallization structure is formed at the second side of the semiconductor substrate, wherein the second metallization structure forms at least one silicide interface region with the semiconductor substrate and at least one non-silicide interface region, or non-silicide interface regions, with the semiconductor substrate.

According to an embodiment, a method for manufacturing a semiconductor device includes providing a semiconductor substrate having a first side and a second side. A first metal layer is formed on and in contact with the second side of the semiconductor substrate. A mask is formed on the first metal layer, the mask comprising openings exposing portions of the first metal layer. The first metal layer is etched using the mask as etching mask to remove the exposed portions of the first metal layer from the second side of the semiconductor substrate and to form first metallization regions which remain on the second side of the semiconductor substrate. The first metallization regions and the second side of the semiconductor substrate are heated to form silicide interface regions between the first metallization regions and the semiconductor substrate, wherein the second side of the semiconductor substrate is heated to a higher temperature than the first side of the semiconductor substrate. A second metal layer is formed on and in contact with the second side of the semiconductor substrate, wherein the second metal layer completely covers the first metallization regions and forms one or more non-silicide interface regions with the semiconductor substrate.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 1A to 1E illustrate processes of a method according to an embodiment.

FIGS. 3A to 3B illustrate variations of processes of a method according to an embodiment.

FIGS. 4A to 4C illustrate different patterns of a first metallization regions and a second metallization regions according to various embodiments.

DETAILED DESCRIPTION

Figure 1A:
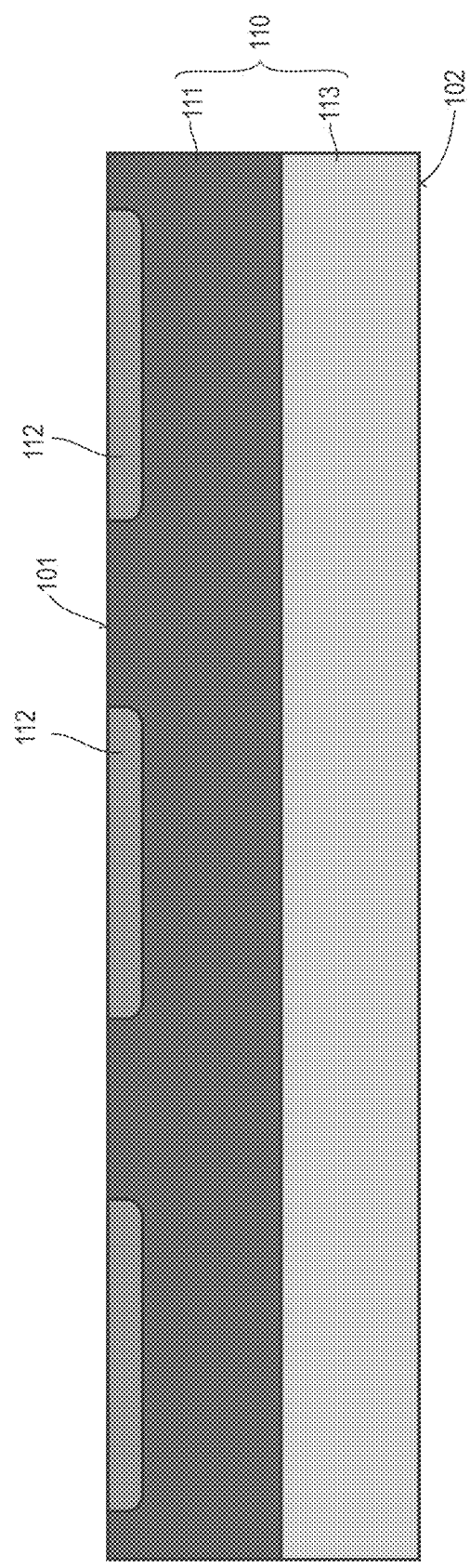

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

The components in the Figures are not necessarily to scale, instead emphasis being placed upon illustrating the principles of the invention. Moreover, in the Figures, like reference signs designate corresponding parts.

FIGS. 1A to 1E illustrate processes of a method according to an embodiment.

A semiconductor substrate 110 having a first side 101 and a second side 102 opposite to the first side 101 is provided. The semiconductor substrate 110 can include a first doping region 111 of a first conductivity type. In the present embodiment, the first conductivity type is n-doped but can also p-doped. The first doping region 111 can form a drift region of a semiconductor device that is to be formed in the semiconductor substrate 110.

A second doping region 112 of a second conductivity type can be formed in the semiconductor substrate 110 and can be particularly integrated in the first doping region 111. The first and second doping regions 111, 112 form a pn-junction which is the main or load pn-junction for controlling a current flow from the first side 101 to the second side 102 of the semiconductor substrate 110. The second doping region 112 is formed at the first side 101 of the semiconductor substrate 110.

The semiconductor substrate 110 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above-mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used. In the present embodiment, the semiconductor material is SiC.

FIG. 1A shows a plurality of second doping regions 112 which are laterally spaced from each other in the vertical cross-section of the semiconductor substrate 110 of FIGS. 1A to 1E. Portions of the first doping region 111 between the laterally spaced apart second doping regions 112 extend to the first side 101 of the semiconductor substrate 110. The first and second doping regions 111, 112 are arranged alternatingly or in a given pattern at the first side 101 of the semiconductor substrate 110. Each of the second doping region 112 forms with the first doping region 111 a respective pn-junction. The first doping region 111 extends deeper into the semiconductor substrate 110 than the second doping regions 112.

The semiconductor substrate 110 further includes a third doping region 113 extending to the second side 102 of the semiconductor substrate 110. The third doping region 113 may be a highly doped region of the first conductivity type and may form a cathode region of a diode, or a drain region of a field-effect transistor. In further embodiments, the third doping region 113 may form a backside emitter of an IGBT. The third doping region 113 may form an nn- or pp-interface with the first doping region 111. The third doping region 113 may alternatively form a pn-interface with the first doping region 111.

The third doping region 113 can be formed by a highly-doped portion of a wafer on which an epitaxial layer has been formed. The first and second doping regions 111, 112 are integrated in the epitaxial layer. For example, the third doping region 113 can be formed by a 4H-SiC substrate which can be highly n-doped. The third doping region 113 can have a thickness of about 110 μm. The first and second doping regions 111 and 112 are formed integral in a common epitaxial layer, which can be an n-doped layer having a base doping concentration of $2 \times 10^{16}$ $cm^{-3}$ and a thickness of about 4.5 μm. The thickness depends on the desired rated blocking voltage of the final semiconductor device and can range between few micrometres and several hundred micrometres.

Alternatively, the first, second, and third doping regions 111, 112, 113 are formed in a common epitaxial layer. The wafer, on which the common epitaxial layer was formed has been removed and is thus not shown in FIG. 1A.

Figure 1B:
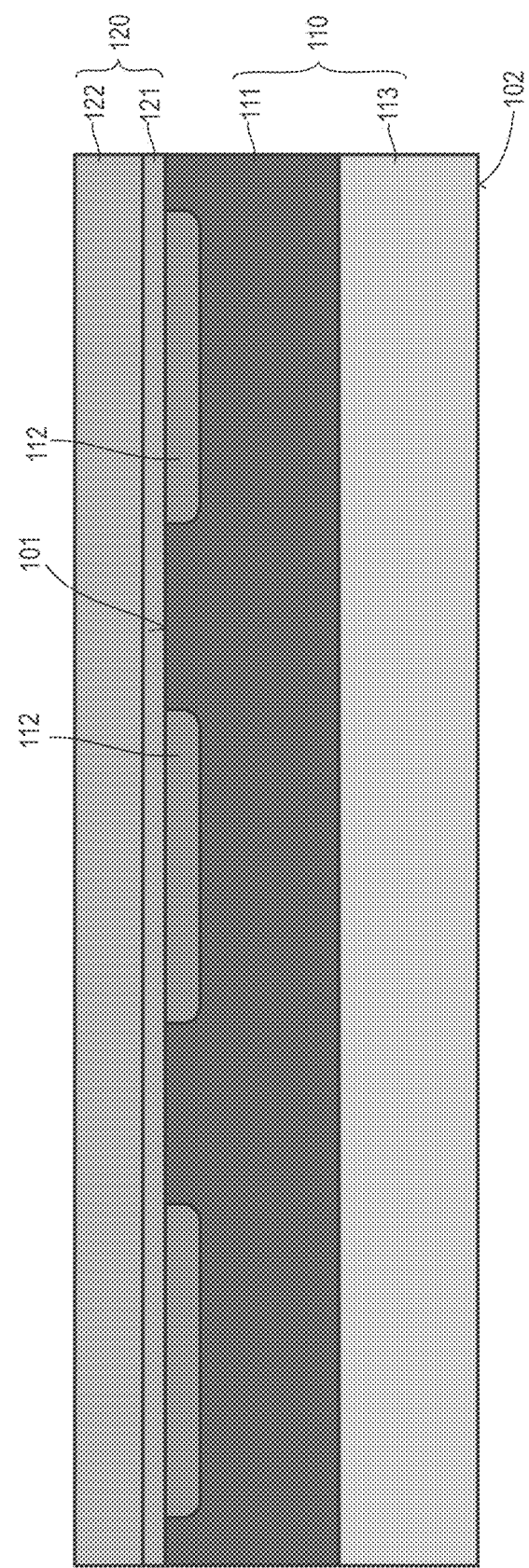

As illustrated in FIG. 1B, a first metallization structure 120 is formed on the first side 101 of the semiconductor substrate 110 and on and in contact with either the first doping region 111, the second doping region 112, or both doping regions 111, 112. FIG. 1B illustrates a contact of the first metallization structure 120 with both the first and the second doping regions 111, 112, respectively.

The first metallization structure 120 can include a first metal layer 121 and a second metal layer 122 on the first metal layer 121. The first metal layer 121 can be arranged between the first side 101 of the semiconductor substrate 110 and the second metal layer 122. Furthermore, the first metal layer 121 is in direct contact with the first side 101 of the semiconductor substrate 110 and the first and/or the second doping regions 111, 112.

The first metal layer 121 of the first metallization structure 120 can form, for example, respective Schottky contacts with portions of the first doping region 111 which are exposed at the first side 101 and respective ohmic contacts with the second doping regions 112. The first metal layer 121 can be, for example, a molybdenum nitride layer which allows formation of good Schottky contacts with the first doping region 111.

According to an embodiment, the first metallization structure 120 does not form silicide interface regions with the semiconductor substrate 110. In alternative embodiments, the first metallization structure 120 may form silicide interface regions in given sections.

The second metal layer 122 on the first metal layer 121 can be, for example, a copper layer or a layer of a copper alloy containing copper as main component to provide a low ohmic resistance layer which also distributes and dissipates heat generated during operation of the semiconductor device.

The second metal layer 122 is typically thicker than the first metal layer 121 to improve heat dissipation. The first metal layer 121 does not need to be very thick as it mainly serves to providing the desired Schottky and ohmic contacts. Since migration of copper into the semiconductor substrate 110 is undesired, the first metal layer 121 may also function as a diffusion barrier for copper or other metal ions which shall not diffuse into the semiconductor substrate 110.

FIGS. 1A and 1B basically represents so-called front end processes at the first side 101 of the semiconductor substrate 110. These front end processes typically include the formation of all doping regions and of the front side contact metallization of the doping regions at the first side 101.

Figure 1D:
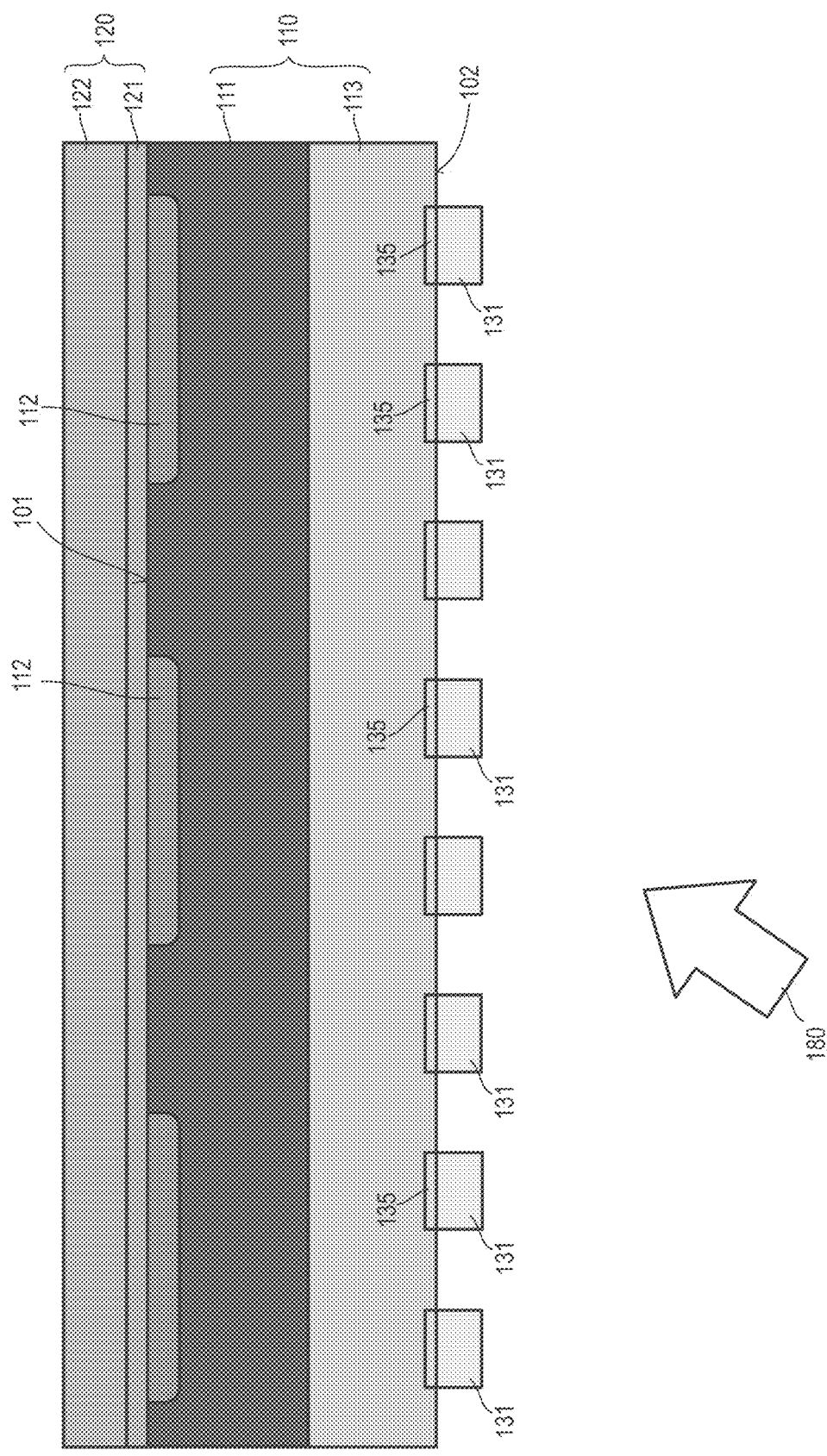
Figure 1E:
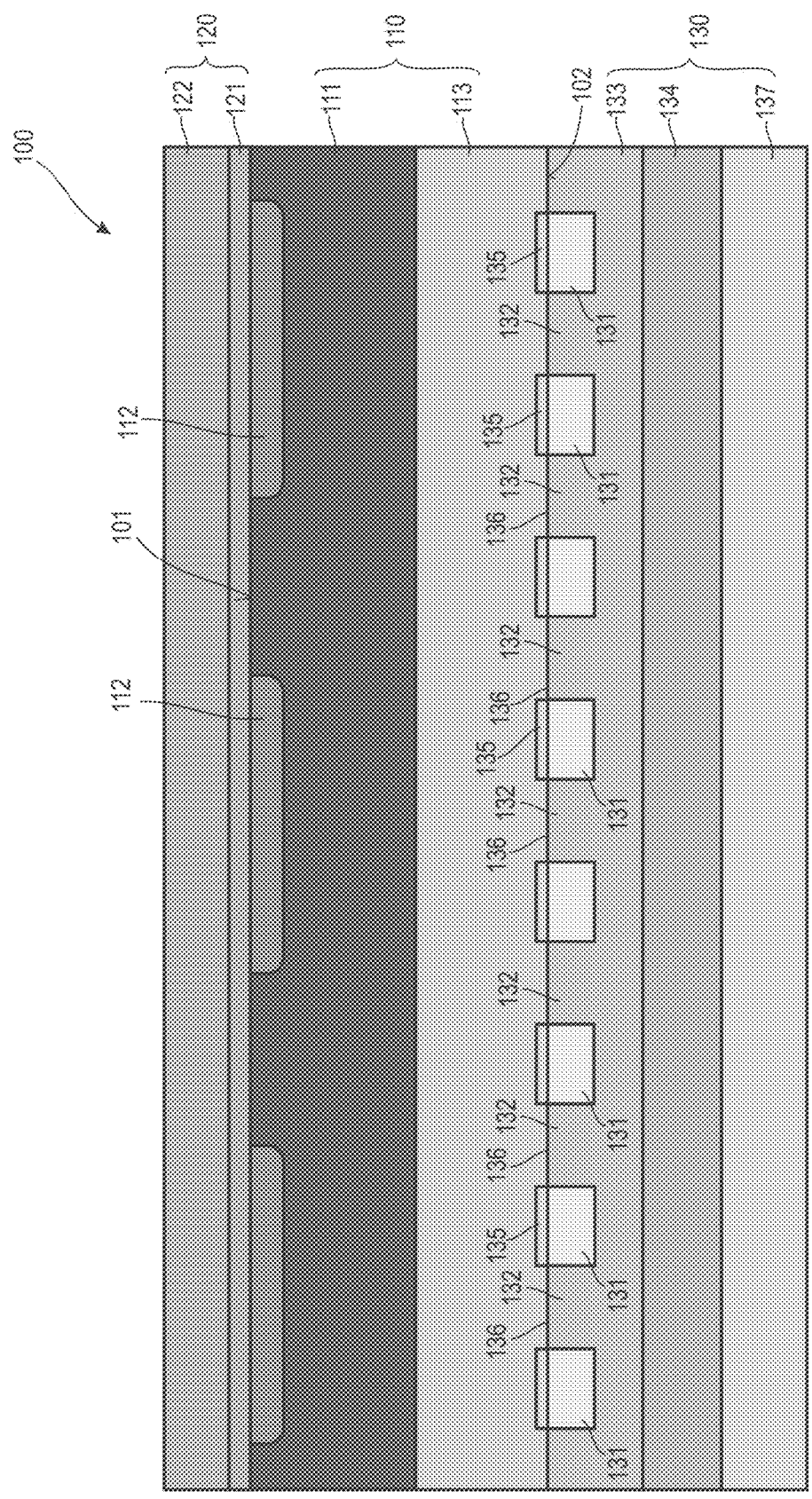

FIGS. 1C to 1E illustrate processes for the formation of a second metallization structure 130 at the second side 102 of the semiconductor substrate 110. These processes are typically carried out after the front end processes, i.e. after the doping regions and the front side contact metallization have been formed at the first side 101. In addition to that, a not shown passivation structure may be formed on the first side 101 prior to forming the second metallization structure.

The first metallization structure 120 includes one or more continuous layers stacked on each other. Different thereto, the second metallization structure 130 includes patterned metal portions and optional additional continuous metal layers. The semiconductor substrate 110 is in contact with at least two different metals or different metal alloy portions, at the second side 102, while it is typically in contact with one metal or metal alloy at the first side 101.

In further embodiments, the first side 101 of the semiconductor substrate 110 may also be in contact with metal portions of different metals which form together the first metallization structure 120.

As illustrated in FIG. 1C, a pattern of first metallization regions 131 are formed on and in direct contact with the second side 102 of the semiconductor substrate 110. The pattern of the first metallization regions 131 can be formed, for example, by forming first a continuous metal layer followed by a selective removal of portions of the continuous metal layer leaving only the first metallization regions 131 on the second side 102 of the semiconductor substrate 110. In an alternative approach, an auxiliary mask is formed on the second side 102 of the semiconductor substrate 110 in regions which shall be kept free from the first metallization regions 131, followed by a blank deposition of a metal for the first metallization regions 131 and a polishing-back or etching-back step down to the auxiliary mask so that only the first metallization regions 131 remain. The auxiliary mask is subsequently removed.

Any process which leads to a desired pattern of the first metallization regions 131 can be used and is referred to as metal patterning process.

In a further process, as illustrated in FIG. 1D, the second side 102 and the pattern of the first metallization regions 131 are selectively subjected to a thermal anneal, which is also referred to as thermal silicidation anneal. The thermal anneal is carried out such that the second side 102 of the semiconductor substrate 110 is heated to a high temperature while the first side 101 of the semiconductor substrate 110 is kept at a comparably low temperature. During the thermal anneal, the temperature at the first side 101 of the semiconductor substrate 110 may also rise but only to an uncritical degree.

According to an embodiment, the thermal anneal includes directing a laser beam to the second side 102 of the semiconductor substrate 110 to heat the pattern of the first metallization regions 131 to a sufficiently high temperature to initiate silicidation of the second side 102 of the semiconductor substrate 110 where the pattern of the first metallization regions 131 is in contact with the semiconductor substrate 110. Such a process is referred to as laser thermal anneal (LTA). Depending on the metal used for the pattern of the first metallization regions 131, the minimum temperature to which the second side 102 is heated may vary, but typically a temperature above 1000° C. is desired.

The first side 101 of the semiconductor substrate 110 is typically kept below 400° C. to avoid silicidation of the semiconductor substrate 110 at the first side 101 and to limit diffusion of dopants of the first and second doping regions 111, 112, respectively. The structures formed at the first side 101, i.e. the interface between the first metal layer 121 of the first metallization structure 120 and the semiconductor substrate 110, and the location and dopant distribution of the first and second doping region 111, 112, and of any further doping region, are not affected, or only marginally influenced by the thermal anneal at the second side 102.

The thick second metal layer 122 of the first metallization structure 120 may help to keep the first side 101 below a critical temperature as it functions as heat sink. Furthermore, the second metal layer 122 can be placed in contact with a large metal heat sink to even better ensure that the first side 101 of the semiconductor substrate 110 is kept at a low temperature when annealing the second side 102.

Heating of the second side 102 is typically limited to a short time and below the melting point of the pattern of the first metallization regions 131. Since a laser beam has a limited beam width, the laser beam is scanned over the second side 102 with a given scan rate so that the desired temperature is achieved. The laser beam is illustrated in FIG. 1D by arrow 180.

Since energy is only locally introduced into the semiconductor substrate 110 by scanning the laser beam over the second side 102, the heating is mainly limited to the region of direct interaction between the laser beam and the semiconductor substrate 110. This also allows to selectively anneal specific portions of the second side 102.

In an alternative embodiment, a flash lamp or flash lamps may be used for the thermal anneal. Such anneal can be referred to as Rapid Thermal Anneal (RTA).

Due to the thermal anneal, the metal of the first metallization regions 131 reacts with the semiconductor substrate 110 and form silicide interface regions 135 as illustrated in FIG. 1D. The thickness of the silicide interface regions 135 is exaggerated in FIG. 1D for illustration purposes only. The first metallization regions 131 do not need to completely transform into a silicide. It is sufficient when only the interface region between the metal of the first metallization region 131 and the semiconductor substrate 110 reacts.

The first metallization regions 131 can comprise, or consist of, a transition metal such as nickel (Ni) or a nickel alloy containing nickel as main component or titanium (Ti) or a titanium alloy containing titanium as main component, a nitride of a transition metal such as titanium nitride (TiN), a silicide of a transition metal such as titanium silicide (TiSi), platinum (Pt) or aluminium (Al), or a combination of these metals, transition metals, nitrides and silicides. For example, nickel forms silicide interface regions having a low electrical contact resistance. The nickel silicide interface regions 135 thus provide a low ohmic electrical connection between the semiconductor substrate 110 and the second metallization region 130. Typically, the silicide interface regions 135 containing $Ni_2Si$ provide a superior low ohmic contact resistance. An alternative is tungsten forming tungsten silicide interface regions 135.

In further processes, as illustrated in FIG. 1E, one or more second metallization regions 132 are formed between spaced apart first metallization regions 131. The second metallization regions 132 can be an integral part of a second metal layer 133 which is deposited on the second side 102 to completely cover and bury the first metallization regions 131.

The main purpose of the second metallization regions 132 is the provision of an improved mechanical adhesion to the semiconductor substrate 110. The second metallization regions 132 have a stronger adhesion to the semiconductor substrate 110 than the first metallization regions 131. The second metallization structure 130 thus includes regions of different adhesion and different ohmic contact resistance. Regions of higher adhesion, i.e. the second metallization regions 132, may alternate with regions of lower adhesion but lower contact resistance, i.e. the first metallization regions 131.

The second metallization regions 132 form non-silicide interface regions 136 with the semiconductor substrate 110 and the first metallization regions 131 form the silicide interface regions 135 with the semiconductor substrate 110. The first and second metallization regions 131, 132 are typically integral with each other forming together a part of the second metallization structure 130. In particular, the first and second metallization regions 131, 132 may be in direct electrical contact with each other, i.e., may directly adjoin each other. According to an embodiment, the semiconductor device includes at least one silicide interface region 135. In further embodiments, the semiconductor device includes a plurality of silicide interface regions 135 which can optionally be spaced apart from each other.

To improve structural stability, the second metal layer 133 is integral with the second metallization regions 132 which are formed as extensions toward the second side 102 of the semiconductor substrate 110. The second metal layer 133 together with the second metallization regions 132 completely surround the first metallization regions 131 and form a metallurgic bond with the first metallization regions 131. In particular, the second metal layer 133 together with the second metallization regions 132 may completely surround the first metallization regions 131 at a side of the first metallization region 131 that is opposite the semiconductor substrate 110. For example, the second metallization regions 132 may originate from the second metal layer 133 and/or may be formed in one piece with the second metallization regions 132. The second metal layer 133 may have a mechanically stabilizing function for the first metallization regions 131. In a cross-section view as for example shown in FIG. 1E, the second metal layer 133 and the second metallization regions 131 form a comb-like structure with the spaces between the combs filled with the first metallization regions 131. At the side facing the second side 102 of the semiconductor substrate 110, the first and second metallization regions 131, 132 provide together a substantially flat surface of the second metallization structure 130 being in contact with the second side 102 of the semiconductor substrate 110.

According to an embodiment, the second metal layer 133 and the second metallization regions 132 can be made of a different metal or metal alloy than the first metallization regions 131. This allows adaptation of the properties of the respective metal regions on the specific needs. According to an embodiment, the second metal layer 133 including the second metallization regions 132 includes, or consists of, titanium, an alloy containing titanium as main component, titanium nitride or another nitride, platinum, aluminium, or a combination or alloy of these metals and metal nitrides. Titanium shows a very good adhesion to the semiconductor material of the semiconductor substrate 110 and thus improves the overall mechanical stability and adhesion of the second metallization structure 120. Since the strongly adherent second metal layer 133 completely covers the first metallization regions 131, a reliable structure is obtained which also ensures that the first metallization regions 131 remain adherent.

According to an embodiment, the second metal layer 133, the second metallization regions 132, and the first metallization regions 131 are made of the same metal or the same metal alloy. For example, the second metal layer 133 and the second metallization regions 132 are made of tungsten and form the non-silicide interface region 136 since the second metal layer 133 and the second metallization regions 132 are not subjected to a thermal silicidation anneal. The first metallization regions 131 can also be made of tungsten and form the silicide interface region 135 since the first metallization regions 131 were subjected to the thermal silicidation anneal. Using the same material for the first and the second metallization regions 131, 132 also improves the contact and adhesion between the first and the second metallization regions 131, 132.

The first metallization regions 131 and the second metallization layer 133 are also forming low ohmic interfaces with each other. This contributes to the overall low ohmic resistance of the whole patterned metallization structure formed by the first metallization regions 131 and the second metal layer 133 including the second metallization regions 132.

The second metal layer 133 can be formed by a conformal deposition of metal to fill the spaces between adjacent first metallization regions 131 and to form intimate contact with those portions of the second side 102 of the semiconductor substrate 110 which are not covered by the first metallization regions 131. The metal deposition continues until the spaces between the first metallization regions 131 are completely filled and a desired layer thickness has been produced. Typically, e-beam evaporation or a sputter process is used for deposition of the second metal layer 133 and the second metallization regions 132. An example is Ti deposition.

According to an embodiment, the first metallization regions 131 are subjected to a cleaning process prior to the deposition of the second metal layer 133 to ensure an intimate contact and formation of metallurgical bonds between the second metal layer 133 and the first metallization regions 131. This also improves the mechanical stability of the patterned metallization structure formed by the first metallization regions 131, the second metallization regions 132, and the second metallization layer 133.

In a further process, a third metal layer 134 is formed on and in contact with the second metal layer 133. The third metal layer 134 can be for example a pure nickel or a nickel vanadium layer. This layer is beneficial to provide good solderability during a die attach process.

For completing the second metallization structure 130, a fourth metal layer 137 can be optionally formed on and in contact with the third metal layer 134. The fourth metal layer 137 can be for example a silver layer which protects the third metal layer 134, such as a nickel vanadium from oxidation. In addition to that, the fourth metal layer 137 may also improve solderability and heat dissipation.

Different to the first metallization regions 131 and the second metal layer 133 including the second metallization regions 132, the third and fourth metal layers 134, 137 can be formed as continuous metal layers each having a substantially constant thickness along their lateral extension.

For soldering, such as reflow soldering or wave soldering, the exposed or "last" metal layer of the second metallization structure 130 is typically a nitride layer which provides good solderabilty. For diffusion soldering the exposed or last metal layer of the second metallization structure 130 can be a silver tin (AgSn) or a gold tin (AuSn) layer. The last metal layer can, for example, either the third or the fourth metal layer 134, 137, respectively.

The first metallization regions 131, the second metal layer 133 including the second metallization regions 132, the third metal layer 134, and the fourth metal layer 137 form together the second metallization structure 130 on the second side 102 of the semiconductor substrate 110.

The improvement of the herein described patterned metallization structure, which is part of the second metallization structure 130, over a metallization structure having a continuous nickel layer and a continuous titanium layer on top of the continuous nickel layer will be described in connection with FIG. 5.

Figure 5:
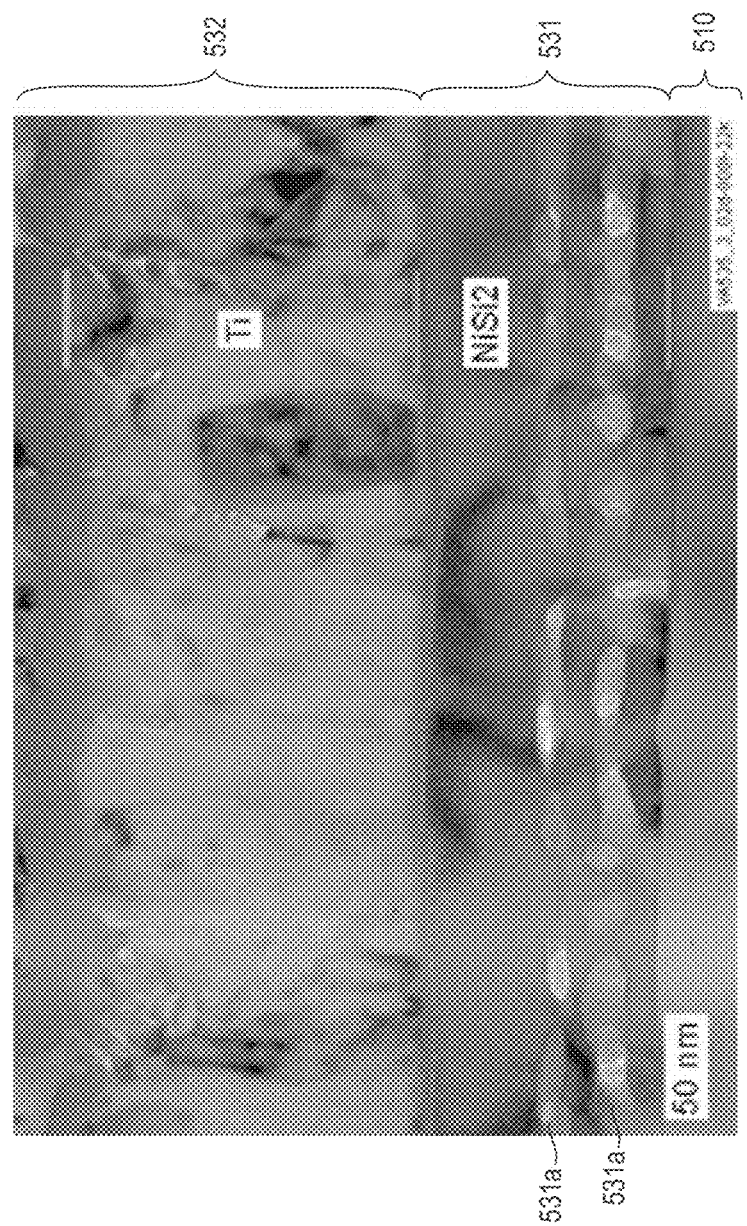
FIG. 5 show a TEM analysis of a backside metallization containing continuous metal layers after an RTA process.

FIG. 5 show a TEM analysis of a backside metallization containing continuous metal layers after an RTA process. The backside metallization includes a nickel layer, which has been transformed into a nickel silicide layer 531 by a RTA process, and a titanium layer 532 on top of the nickel silicide layer 531. The nickel silicide layer 531 is in contact with a SiC semiconductor material 510. During the RTA process, the nickel reacts not only with silicon but also with the carbon contained in the SiC. Therefore, in addition to the silicidation of the nickel, carbon clusters are formed within the nickel silicide layer 531. These carbon clusters appear brighter in the TEM analysis than the nickel silicide. The carbon clusters are indicated at 531a.

The carbon clusters 531a accumulate within the nickel silicide layer 531 and may form a perforation layer which weakens the nickel silicide layer 531. During operation of the semiconductor device, temperature variations may occur which are caused by the On/Off cycle of the semiconductor device. The temperature variations generate mechanical tensions within the metal layers, and also between the metal layers and the semiconductor substrate, and may cause the nickel silicide layer 531 to partially or completely peel off from the semiconductor substrate 510 along the perforation layer created by the carbon clusters.

By providing a patterned metallization structure as described herein, the carbon clusters are only formed within the separated and spaced apart first metallization regions 131 but not within the second metallization regions 132. Therefore, the "perforation layer" is not a continuous layer but interrupted by the second metallization regions 132 being free of carbon clusters and having strong adhesion to the semiconductor substrate 110. The mechanical stress acting on each first metallization regions 131 during thermal cycling is therefore reduced. The reduced size of each first metallization regions 131 relative to a single continuous layer also adds to this improvement. The likelihood can therefore be reduced that a peeling within a single first metallization region 131 may occur. Thus, the whole patterned metallization structure shows improved mechanical stability and adhesion while maintaining good ohmic connection through the first metallization regions.

The patterned metallization structure prevents formation of a continuous carbon clusters layer, or perforation layer, by providing separate regions of high adhesion and regions of low ohmic contact resistance. To keep the overall ohmic contact resistance between the patterned metallization structure and the semiconductor substrate 110 low, the first and second metallization regions 131, 132 are typically uniformly distributed over the second side 102 of the semiconductor substrate 110. Furthermore, the total area ratio between the first metallization regions 131 and the second metallization regions 132 may be adjusted according to specific needs. Typically, the total area ratio between the first metallization regions 131 and the second metallization regions 132 is between 4 and 1.

The silicide interface regions 135 can also be considered as alloyed regions where the metal of the first metallization regions 131 is alloyed with the semiconductor material of the semiconductor substrate 110. The non-silicide interface region 136 can also be considered as non-alloyed regions where the metal of the second metallization regions 132 is not alloyed with the semiconductor material of the semiconductor substrate 110. Alloyed regions typically show a lower electrical contact resistance than non-alloyed regions.

FIGS. 4A to 4C illustrate different patterns of the first metallization regions 131 and the second metallization regions 132. FIG. 4A illustrates a stripe design with alternating first metallization regions 431a and second metallization regions 432a. FIG. 4B illustrates a design with hexagonal first metallization regions 431b surrounded by a simply connected second metallization region 432b. In a cross-sectional view perpendicular to the semiconductor substrate, the second metallization region 432b will appear as separate second metallization regions 432b. FIG. 4C illustrates a further stripe design but with shorter stripes forming the first metallization regions 431c surrounded by a single second metallization region 432c which will also appear as discontinuous layer in a cross-sectional view.

FIGS. 4A to 4C illustrates embodiments where the first metallization regions 131 are formed as separate and spaced apart regions. The second metallization region 132 is a single and simply connected region in FIGS. 4B and 4C while formed of separate regions in FIG. 4A. According to further embodiments, the second metallization regions 132 can be formed as separate and spaced apart regions while the first metallization region 131 is formed as a single and simply connected region.

In the present embodiment of FIGS. 1A to 1E, the semiconductor device is a power diode having a plurality of anode regions. According to further embodiments, the semiconductor device can be a field-effect transistor or an IGBT. In principle, the patterned metallization structure is suitable for all vertical semiconductor power devices which need a backside metallization.

FIGS. 2A to 2E illustrate processes of a method for manufacturing a semiconductor device according to a further embodiment. Structural elements similar to elements of FIGS. 1A to 1E are denoted by reference signs 2XX in FIGS. 2A to 2E and 1XX in FIGS. 1A to 1E with XX meaning the same number.

Figure 2A:
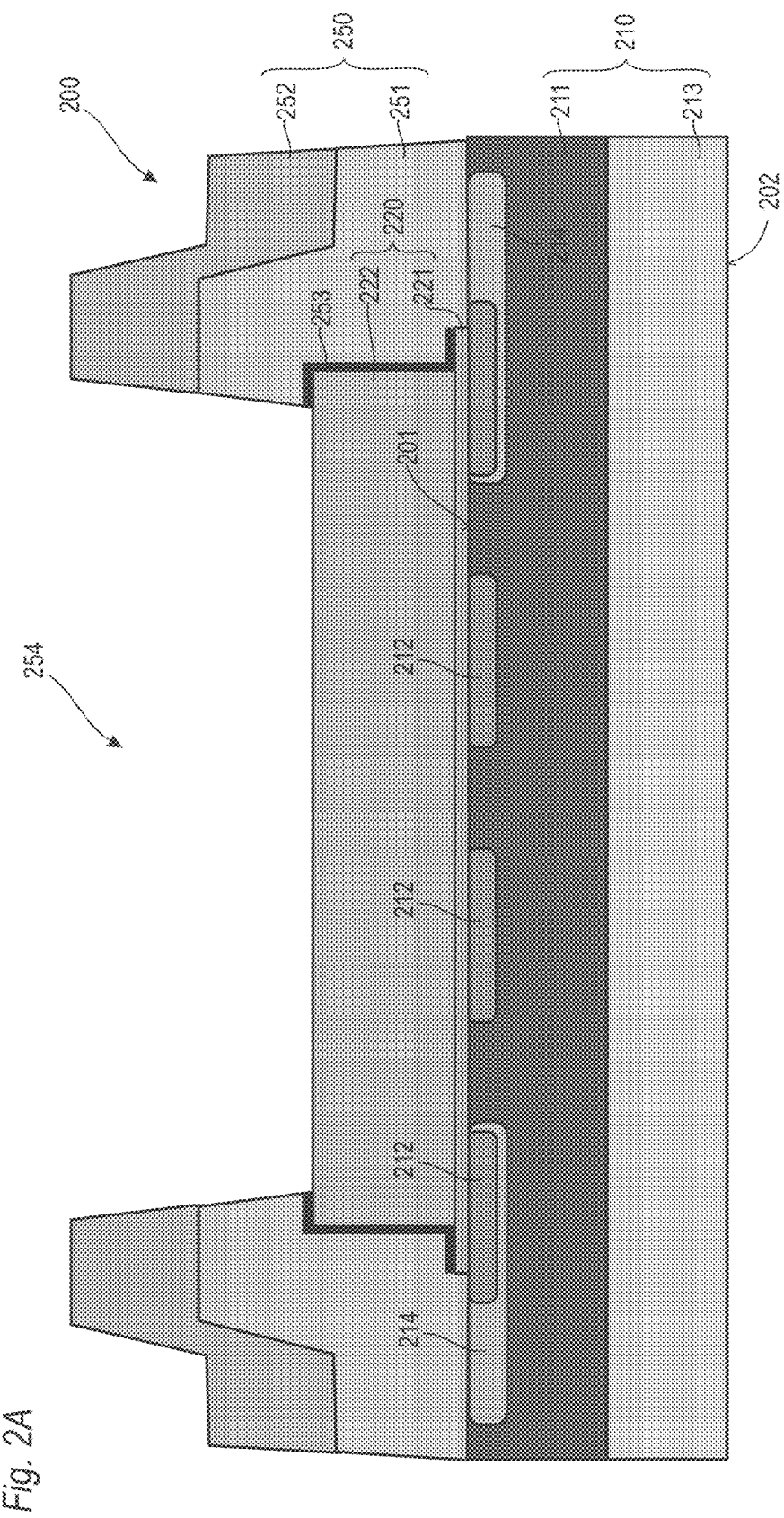
FIGS. 2A to 2E illustrate processes of a method according to an embodiment.

As illustrated in FIG. 2A, a semiconductor substrate 210 is provided. The semiconductor substrate 210 includes a lightly n-doped first doping region 211 which can be formed by an epitaxial layer as described in connection with FIG. 1A. Second doping regions 212 are formed at the second side 201 of the semiconductor substrate 210. In this embodiment, the second doping regions 212 are highly p-doped and form anode regions of a diode. Lightly p-doped anode regions 214 are formed in peripheral regions of the semiconductor device 200 and are provided to distribute the electrical field within the peripheral region. The epitaxial layer can be made of SiC.

The first doping region 211 is formed on a semiconductor base substrate forming a third doping region 213, which can be a highly n-doped SiC material. The third doping region 213 forms the second side 202 of the semiconductor substrate 210.

A first metallization structure 220 is formed on and in contact with the first side 201 of the semiconductor substrate 210 and specifically on and in contact with portions of the first doping region 211 and the second doping regions 212. The first metallization structure 220 comprises a molybdenum nickel layer 221 forming a first metal layer and a copper layer 222 forming a second metal layer of the first metallization structure 220.

The first metallization structure 220 is laterally recessed from edges of the semiconductor substrate 212 and does not extend into peripheral portions of the semiconductor substrate 220. In the embodiment of FIGS. 1A to 1E, the first metallization structure 120 is illustrated to extend to the lateral edges. However, FIGS. 1A to 1E only show a portion of the active area of the semiconductor device. In practical embodiments, the first metallization structure 120 may also be recessed from lateral edges of the semiconductor substrate 110.

A passivation structure 250 is formed in the peripheral portion of the semiconductor device 200 and partially covers lateral edges of the first metallization structure 220. The passivation structure 250 includes an opening 254 to expose an upper surface of the first metallization structure 220. In case of a diode the passivation structure 250 includes only one single large opening 254. In case of a field-effect transistor or an IGBT the passivation structure 250 may include one large opening for exposing the first metallization structure and a further opening for exposing a gate metallization structure.

The passivation structure 250 can include a hard passivation 251 covered by an imide layer 252. A thin silicon nitride layer 253 between the hard passivation 251 and the first metallization structure 220 can be formed to improve adhesion of the passivation structure 250 on the first metallization structure 220.

Similar to the embodiment of FIGS. 1A to 1E, the front end processes for forming structures at the first side of the semiconductor substrate 210 is completed. The front end processes additionally include formation of a passivation structure 250 as exemplarily shown in FIG. 2A.

Figure 2B:
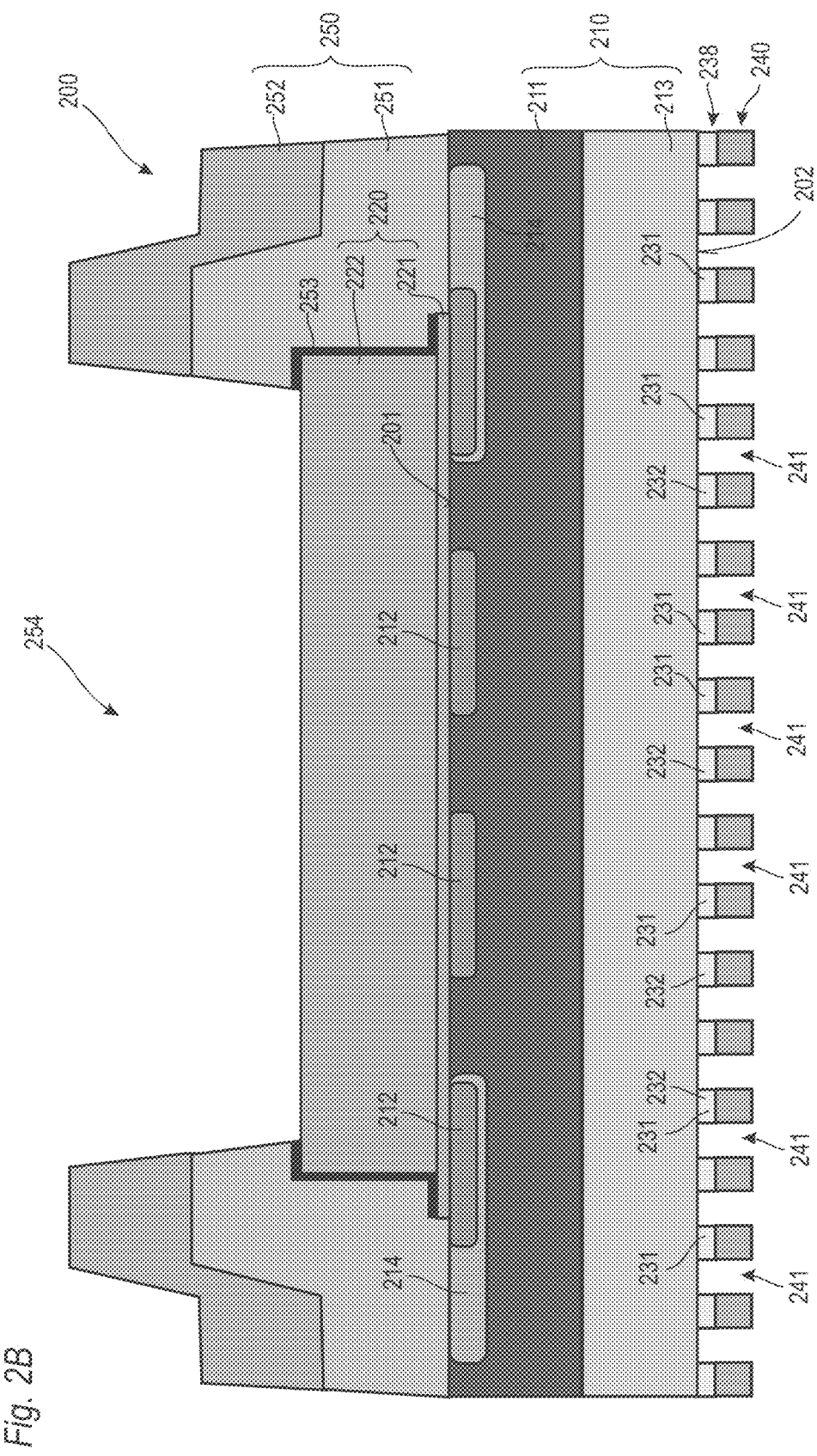

The processes continue with formation of a first metal layer 238 of the second metallization structure on the second side 202 of the semiconductor substrate 210 as illustrated in FIG. 2B. The first metal layer 238 can be initially a continuous layer which completely covers the second side 202 of the semiconductor substrate 210. Similar to the embodiment of FIGS. 1A to 1E, the first metal layer 238 can be a nickel layer or a tungsten layer.

FIG. 2B also shows formation of a mask layer 240 having a plurality of openings 241 on the first metal layer 238. The mask layer 240 can be a resin mask or a hard mask. The openings 241 define regions where the material of the first metal layer 238 shall be subsequently removed.

The layout of the mask layer 240 is adapted to produce the desired layout for the first metallization regions 231. Examples for the desired layout are illustrated in FIGS. 4A to 4C.

Using a dry- or wet-chemical etching, the unmasked portions of the first metal layer 238 are completely removed from the second side 202 of the semiconductor substrate 210.

Figure 2C:
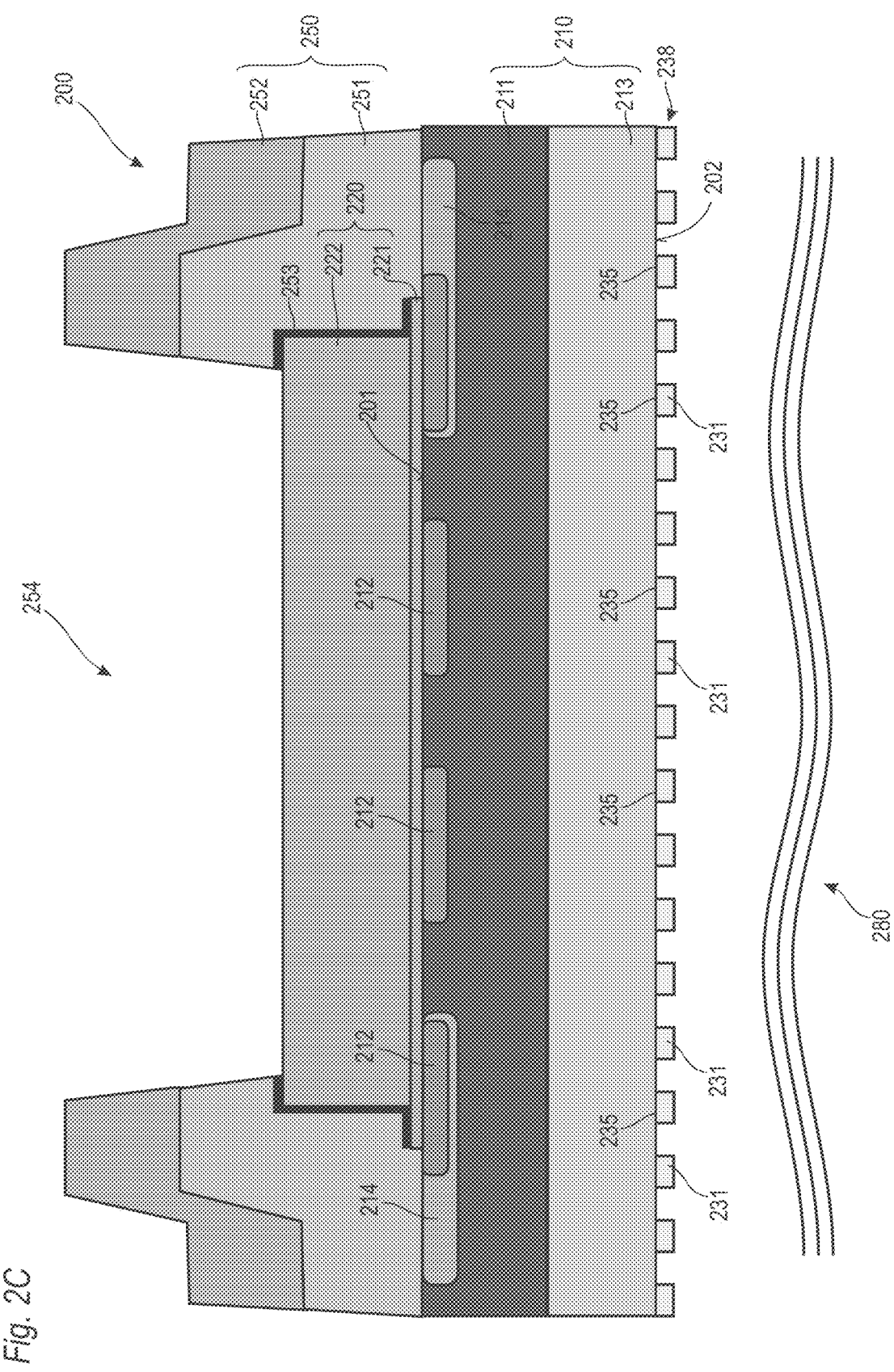

FIG. 2C illustrates the selective thermal silicidation anneal of the second side 202 of the semiconductor substrate 210 as described above. Reference sign 280 indicates the energy selectively provided to the second side 202 of the semiconductor substrate 210. Providing energy initiates silicidation of the first metallization structures 231 to form the silicide interface regions 235 as described further above. In the present embodiment an RTA process is used instead of a LTA process.

The processes continue in a similar manner as described in connection with the embodiment of FIGS. 1A to 1E by forming a second metal layer 233 on the second side 202 of the semiconductor substrate 210 to completely cover the first metallization regions 231. The regions between spaced apart first metallization regions 231, where the second metal layer 233 comes in direct contact with the second side 202 of the semiconductor substrate 210, form respective second metallization regions 232 having interface regions 236 with the semiconductor substrate 210.

The layout of the second metallization regions 232 is linked with the layout of the previously formed first metallization region 231 and is formed automatically when the spaces between the first metallization portions 231 are filled with the first metal layer 238.

The interface regions of the first metallization structures 231 with the semiconductor substrate 210 form the silicide interface regions 235 of the second metallization structure 230 while the interface regions of the second metallization regions 232 with the semiconductor substrate 210 form the non-silicide interface regions 236 of the second metallization structure 230.

In further processes the third metal layer 234 and the fourth metal layer 237 are formed in this order to complete the second metallization structure 230.

The thus formed semiconductor device 200 is soldered with its second metallization structure 230 to a carrier substrate 260 having a lead structure 261. A solder layer 262 may be formed either on the lead structure 261 or on the fourth metal layer 237 of the second metallization structure 230 prior to soldering. The solder layer 262 may be a Pb-based solder or an AgSn-based solder.

The carrier substrate 260 may also include a front contact 263 to provide an electrical connection to the first metallization structure 220. The front contact 263 may also be soldered to the first metallization structure 220 or may be provided as bond wire or bond wires. Typically, a copper-based layer or copper-based layers are provided for the front contact 263. For soldering the front contact 263, an Sn—Ag alloy can be applied to the front contact 263.

Figure 2D:
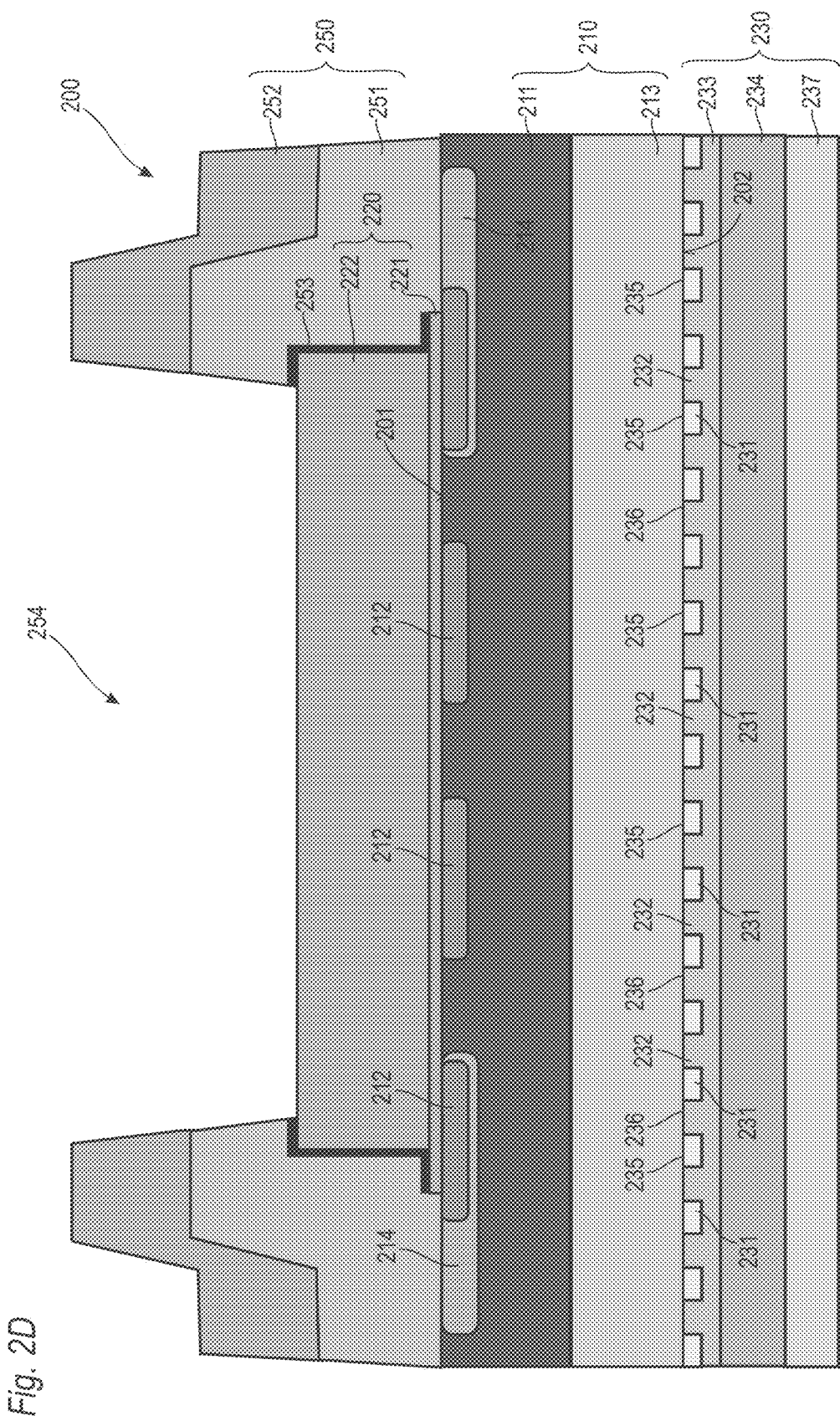
Figure 2E:
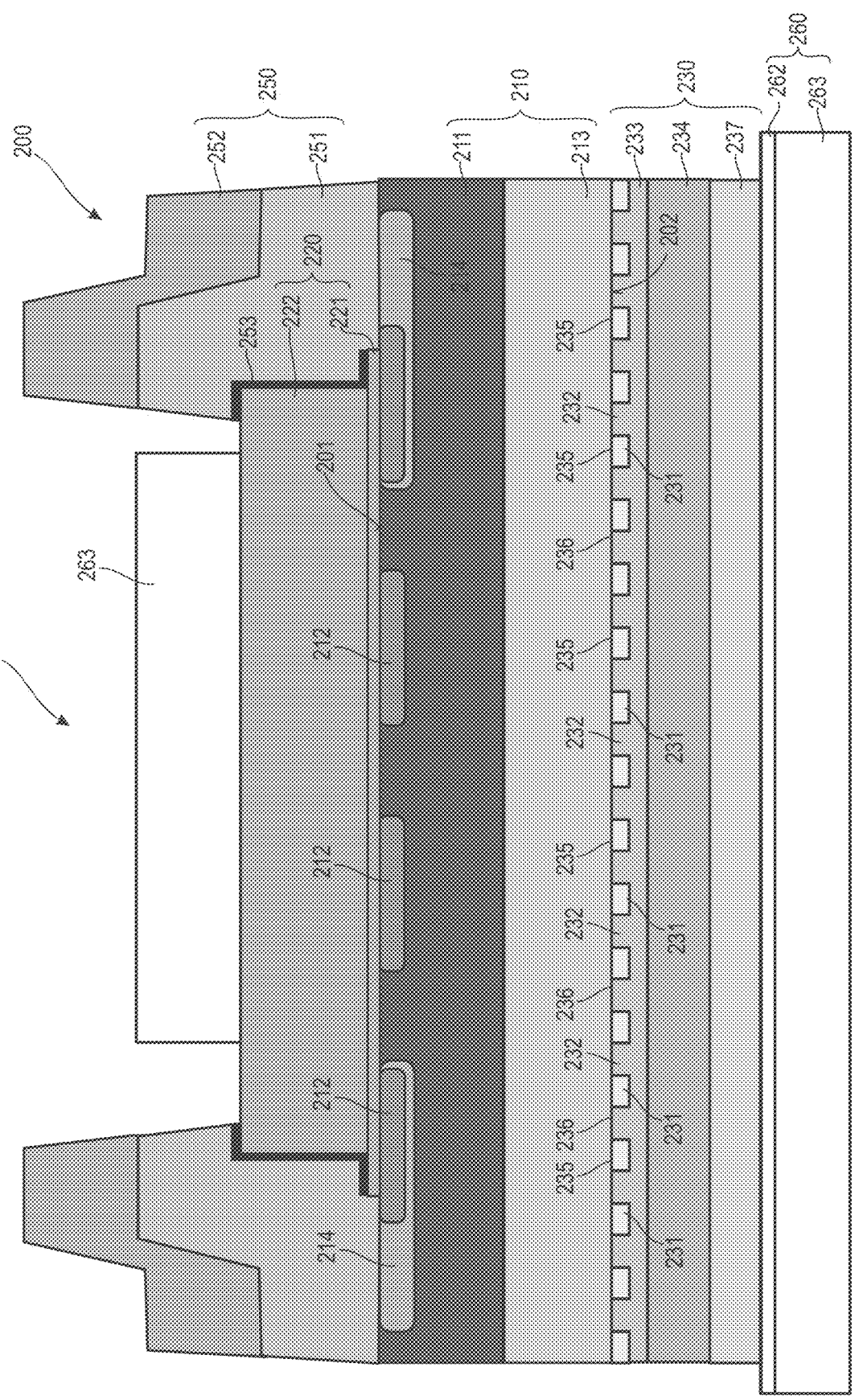
Figure 3B:
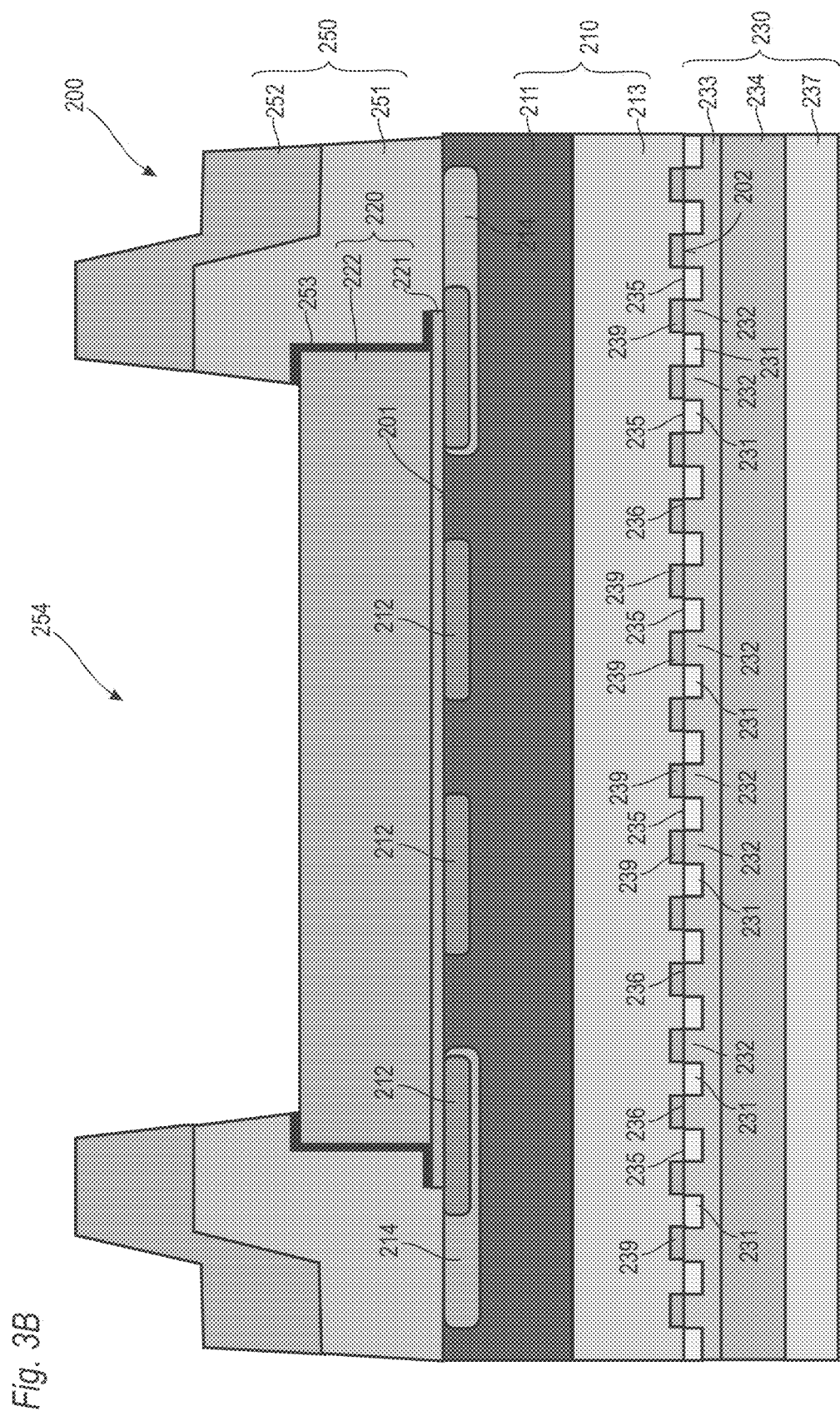

FIGS. 3A and 3B illustrate a variation of the embodiment shown in FIGS. 2A to 2E. Prior to the thermal silicidation anneal of the second side 202 of the semiconductor substrate 210 an optional implantation step can be carried out to form doping regions 239 at the second side 202 of the semiconductor substrate 210. The implantation can be carried out either prior to removing the mask layer 240 or after removal of the mask layer 240, but typically after etching of the first metal layer 238.

Nitrogen can be implanted using either the mask layer 240 or, after removal of the mask layer 240, the patterned first metal layer 238, i.e. the first metallization regions 231, as implantation mask. Implanted nitrogen can be activated by the subsequent thermal silicidation anneal 280 to reduce the ohmic contact resistance between the second metallization regions 232 and the semiconductor substrate 210. An additional thermal anneal for activating is not needed but can be carried out if desired.

The implantation is self-adjusted relative to the first metallization regions 231 so that nitrogen is only implanted in the regions of the semiconductor substrate 220 not covered by the first metallization regions 231. The doping regions 239 will therefore be directly below the second metallization region or regions 232 and improves the electrical contact of the non-silicide interface regions 236.

FIG. 3B illustrates the further processes as illustrated in FIG. 2D. The semiconductor substrate 200 can optionally also be soldered to a carrier substrate 260 similar to the embodiment shown in FIG. 2E.

In the following, further embodiments of the semiconductor device and/or the method as described herein are explained in detail. It is to be understood that the features mentioned above and those yet to be explained below may be used not only in the respective combinations indicated, but also in other combinations or in isolation without departing from the scope of the invention. In general, the method described herein may be used for manufacturing a semiconductor device as described herein. That is to say, all features disclosed in connection with the method may also be disclosed for the semiconductor device and vice versa.

According to at least one embodiment of the semiconductor device, the semiconductor device comprises a semiconductor substrate with a first side and a second side; at least one doping region formed at the first side of the semiconductor substrate; a first metallization structure at the first side of the semiconductor substrate and on and in contact with the at least one doping region; and a second metallization structure at the second side of the semiconductor substrate, the second metallization structure forming at least one silicide interface region with the semiconductor substrate and at least one non-silicide interface region with the semiconductor substrate.

According to at least one embodiment of the semiconductor device, the semiconductor substrate comprises SiC. The semiconductor substrate may consist of SiC, except for impurities and/or dopants. Throughout this specification, if a component "consists" of a material, it is possible that the component is made entirely of the material, except for impurities caused by manufacturing processes and/or dopants.

According to at least one embodiment of the semiconductor device, wherein the semiconductor substrate comprises a first doping region of a first conductivity type at the first side of the semiconductor substrate; and a second doping region of a second conductivity type at the first side of the semiconductor substrate. The first metallization structure is on and in contact with the first doping region of the first conductivity type and the second doping region of the second conductivity type.

According to at least one embodiment of the semiconductor device, the at least one silicide interface region and the at least one non-silicide interface region of the second metallization structure are in contact with a third doping region formed at the second side of the semiconductor substrate.

According to at least one embodiment of the semiconductor device, the second metallization comprises first metallization regions and second metallization regions, wherein the first metallization regions form respective silicide interface regions with the semiconductor substrate, and wherein the second metallization regions form respective non-silicide interface regions with the semiconductor substrate.

According to at least one embodiment of the semiconductor device, the first metallization regions and the second metallization regions comprise different metals. In particular, the first metallization region may consist of a metal or a metal alloy and the second metallization region may consist of a metal silicide.

According to at least one embodiment of the semiconductor device, the second metallization regions surround the first metallization regions. In addition or as an alternative, the second metallization regions are in direct contact with the semiconductor substrate.

According to at least one embodiment of the semiconductor device, the first metallization regions comprise at least one of: nickel, nickel alloy containing nickel as main component, titanium, titanium alloy containing titanium as main component, a metal nitride, a metal silicide, platinum, and aluminium, or a combination thereof. Further, the silicide interface regions comprise a metal silicide such as nickel silicide or titanium silicide.

According to at least one embodiment of the semiconductor device, wherein the second metallization comprises a second metal layer comprising the second metallization regions, wherein the second metal layer completely covers the first metallization regions.

According to at least one embodiment of the semiconductor device, the second metallization layer and the second metallization regions comprise at least one of titanium, titanium alloy containing titanium as main component, a metal nitride such as titanium nitride, platinum, and aluminum, or a combination thereof.

According to at least one embodiment of the semiconductor device, the semiconductor device further comprises a passivation structure at the first side of the semiconductor substrate, wherein the passivation structure covers lateral edges of the first metallization structure and comprises at least one opening to expose a central part of the first metallization.

According to at least one embodiment of the semiconductor device, the semiconductor device is one of a bipolar device power device and a unipolar power device.

According to at least one embodiment of the semiconductor device, the semiconductor device comprises a carrier substrate comprising at least one lead structure, wherein the semiconductor device is soldered with the second metallization structure to the lead structure of the carrier substrate.

According to at least one embodiment of the semiconductor device, the semiconductor device comprises n-type doped regions, such a regions doped with nitrogen, phosphorous, arsenic, or a combination thereof, at the second side of the semiconductor substrate between the first metallization regions.

According to at least one embodiment of a method for manufacturing a semiconductor device, the method comprises providing a semiconductor substrate comprising a first side and a second side; forming at least one doping region at the first side of the semiconductor substrate; forming a first metallization structure at the first side of the semiconductor substrate on and in contact with the at least one doping region; and subsequently forming a second metallization structure at the second side of the semiconductor substrate, the second metallization structure forming at least one silicide interface region with the semiconductor substrate and at least one non-silicide interface region with the semiconductor substrate.

According to at least one embodiment of the method, forming the second metallization structure comprises forming first metallization regions on and in contact with the second side of the semiconductor substrate; thermally annealing the first metallization regions to form the at least one or respective silicide interface regions between the first metallization regions and the semiconductor substrate; and forming second metallization regions on and in contact with the second side of the semiconductor substrate, wherein the second metallization regions form the at least one or respective non-silicide interface regions with the semiconductor substrate.

According to at least one embodiment of the method, forming the first metallization regions comprises forming a first metal layer on and in contact with the second side of the semiconductor substrate, and etching the first metal layer using an etching mask to form the first metallization regions. Here, forming second metallization regions comprises forming a second metal layer which completely covers the first metallization regions and which forms, between the first metallization regions, the second metallization regions.

According to at least one embodiment of the method, the method comprises forming, prior to forming the second metallization structure, a passivation structure at the first side of the semiconductor substrate, wherein the passivation structure covers lateral edges of the first metallization and comprises at least one opening to expose a central part of the first metallization.

According to at least one embodiment of the method, the method comprises providing a semiconductor substrate comprising a first side and a second side; forming a first metal layer on and in contact with the second side of the semiconductor substrate; forming a mask on the first metal layer, the mask comprising openings exposing portions of the first metal layer; etching the first metal layer using the mask as etching mask to remove the exposed portions of the first metal layer from the second side of the semiconductor substrate and to form first metallization regions which remains on the second side of the semiconductor substrate; heating the first metallization regions and the second side of the semiconductor substrate to form silicide interface regions between the first metallization regions and the semiconductor substrate, wherein the second side of the semiconductor substrate is heated to a higher temperature than the first side of the semiconductor substrate; and forming a second metal layer on and in contact with the second side of the semiconductor substrate, wherein the second metal layer completely covers the first metallization regions and form one or more non-silicide interface regions with the semiconductor substrate.

According to at least one embodiment of the method, the method comprises forming, prior to forming the first metal layer, at least one doping region at the first side of the semiconductor substrate; forming a first metallization structure at the first side of the semiconductor substrate and on and in contact with the at least one doping region; and optionally forming a passivation structure at the first side of the semiconductor substrate, wherein the passivation structure covers lateral edges of the first metallization structure and comprises at least one opening to expose a central part of the first metallization structure.

According to at least one embodiment of the method, heating the first metallization regions and the second side of the semiconductor substrate comprises directing at least one laser beam on the first metallization regions and the second side of the semiconductor substrate.

According to at least one embodiment of the method, the method comprises implanting n-type dopants, such as nitrogen, arsenic, phosphorus, or a combination thereof, into the second side of the semiconductor substrate after formation of the first metallization regions.

By using the approach described herein a backside metallization, or second metallization structure, can be provided particularly for SiC-based semiconductor devices. The second metallization structure can include spaced apart silicide interface regions and at least one non-silicide interface region, typically a plurality of non-silicide interface regions, which are all in direct contact with the second side of the semiconductor substrate. The silicide interface regions may be formed by nickel/nickel silicide or tungsten/tungsten silicide. The non-silicide interface regions may be formed by a tungsten layer. The non-silicide interface regions provide the desired mechanical adhesion to the semiconductor substrate while the silicide interface regions provide the desired low ohmic connection to the semiconductor substrate. This patterned arrangement of silicide interface regions and non-silicide interface regions avoids formation of a continuous layer of carbon clusters which otherwise may weaken the mechanical stability of a single continuous silicide layer or large area silicide layers.

The material of the second metallization region or regions comes in contact with the semiconductor substrate as deposited, i.e. this material is not subjected to a thermal silicidation anneal. It is noted that further thermal anneals may be carried out for other purposes. However, these additional thermal anneals are adapted such that no silicidation of the second metallization regions occur.

The total area where carbon clusters can be formed and also the respective size of the silicide interface regions are reduced. The probability that a delamination of the second metallization structure from the semiconductor substrate during thermal cycling occurs is therefore significantly reduced.

REFERENCE LIST 100, 200 semiconductor device
101, 201 first side of semiconductor substrate
102, 202 second side of semiconductor substrate
110, 210 semiconductor substrate
111, 211 first doping region
112, 212 second doping region
113, 213 third doping region
214 lightly doped regions
120, 220 first metallization structure
121, 221 first metal layer of the first metallization structure 122, 222 second metal layer of the first metallization structure
130, 230 second metallization structure
131, 231 first metallization region
132, 232 second metallization region
133, 233 second metal layer
134 third metal layer
135, 235 silicide interface region
136, 236 non-silicide interface region
137, 237 fourth metal layer
238 first metal layer
239 N-implant
240 mask layer
241 openings of mask layer
250 passivation structure
251 hard passivation
252 imide
253 nitride layer
254 opening
260 carrier substrate
261 lead structure
262 solder layer
263 front contact
180 laser beam
280 thermal anneal

What is claimed is:

1. A method for manufacturing a semiconductor device, the method comprising:
providing a semiconductor substrate comprising a first side and a second side;
forming a first metal layer on and in contact with the second side of the semiconductor substrate;
forming a mask on the first metal layer, the mask comprising openings exposing portions of the first metal layer;
etching the first metal layer using the mask as an etching mask to remove the exposed portions of the first metal layer from the second side of the semiconductor substrate and to form first metallization regions which remain on the second side of the semiconductor substrate;
heating the first metallization regions and the second side of the semiconductor substrate to form silicide interface regions between the first metallization regions and the semiconductor substrate, the second side of the semiconductor substrate being heated to a higher temperature than the first side of the semiconductor substrate; and
forming a second metal layer on and in contact with the second side of the semiconductor substrate, the second metal layer completely covering the first metallization regions and forming one or more non-silicide interface regions with the semiconductor substrate.

2. The method of claim 1, wherein the first metallization regions transform only partly into a silicide to form the silicide interface regions.

3. The method of claim 1, wherein:
the first metal layer is a molybdenum nitride layer; and
the second metal layer is a copper layer or a layer of a copper alloy.

4. The method of claim 1, further comprising, prior to forming the first metal layer:
forming at least one doping region at the first side of the semiconductor substrate;
forming a first metallization structure at the first side of the semiconductor substrate and on and in contact with the at least one doping region.

5. The method of claim 1, further comprising:
forming a passivation structure at the first side of the semiconductor substrate, the passivation structure covering lateral edges of the first metallization structure and comprising at least one opening to expose a central part of the first metallization structure.

6. The method of claim 1, wherein heating the first metallization regions and the second side of the semiconductor substrate comprises:
directing at least one laser beam on the first metallization regions and the second side of the semiconductor substrate.

7. The method of claim 6, wherein the second side of the semiconductor substrate is heated to a temperature above 1000° C. by the at least one laser beam.

8. The method of claim 6, further comprising:
limiting the heating of the second side of the semiconductor substrate by the at least one laser beam to below a melting point of the first metallization regions.

9. The method of claim 8, wherein limiting the heating of the second side of the semiconductor substrate comprises:
scanning the at least one laser beam over the second side of the semiconductor substrate with a scan rate that keeps the heating of the second side of the semiconductor substrate below the melting point of the first metallization regions.

10. The method of claim 1, further comprising:
implanting n-type dopants into the second side of the semiconductor substrate after formation of the first metallization regions.

* * * * *